United States Patent
Brofman et al.

(10) Patent No.: US 6,220,499 B1
(45) Date of Patent: Apr. 24, 2001

(54) METHOD FOR ASSEMBLING A CHIP CARRIER TO A SEMICONDUCTOR DEVICE

(75) Inventors: Peter J. Brofman; Shaji Faroog; John U. Knickerbocker, all of Hopewell Junction; Scott I. Langenthal, Hyde Park; Sudipta K. Ray, Wappingers Falls; Kathleen A. Stalter, Hopewell Junction, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/163,150

(22) Filed: Sep. 29, 1998

(51) Int. Cl.⁷ .............................. B23K 31/00; B23K 31/02
(52) U.S. Cl. ................ 228/180.22; 228/119; 228/180.21
(58) Field of Search .................... 228/119, 111, 228/205, 180.21, 179.1, 1.1, 4.5, 56.3, 180.22

(56) References Cited

U.S. PATENT DOCUMENTS

| | | | |
|---|---|---|---|
| 4,661,192 | 4/1987 | McShane | 156/292 |
| 4,752,027 | 6/1988 | Gschwend | 228/180.2 |
| 5,167,361 | 12/1992 | Liebman et al. | 228/180.2 |
| 5,193,732 | * 3/1993 | Interrante et al. | 228/1.1 |
| 5,288,007 | * 2/1994 | Interrante et al. | 228/119 |
| 5,324,892 | 6/1994 | Granier et al. | 174/250 |
| 5,325,265 | * 6/1994 | Turlik et al. | 361/702 |
| 5,435,482 | 7/1995 | Variot et al. | 228/254 |
| 5,447,264 | * 9/1995 | Koopman et al. | 28/563 |
| 5,468,681 | 11/1995 | Pasch | 437/183 |
| 5,469,072 | * 11/1995 | Williams et al. | 324/754 |
| 5,571,593 | * 11/1996 | Arldt et al. | 428/131 |
| 5,766,670 | * 6/1998 | Arldt et al. | 427/8 |
| 5,796,590 | * 8/1998 | Klein | 361/774 |
| 5,842,881 | * 12/1998 | Ecker et al. | 439/329 |

OTHER PUBLICATIONS

B.D. Martin, et al. "Chip Protective Coating", IBM Technical Disclosure Bulletin, vol. 23, No. 5 Oct. 1980, pp 1877–1878.

Puttlitz, et al. "Solder Transfer Technique for Flip Chip and Electronic Assembly Applications", IEEE 46ᵗʰ ECTC, May 28–31, 1996, Orlando Fla, pp. 559–564.

* cited by examiner

Primary Examiner—Patrick Ryan
Assistant Examiner—Zidia T. Pittman
(74) Attorney, Agent, or Firm—Ira D. Blecker

(57) ABSTRACT

A semiconductor device having C-4 solder connections is joined to a chip carrier having pads suitable for receiving the C-4 solder connections. Sacrificial solder is formed on the chip carrier pads and then planarized to result in a good, planar surface profile for joining to the semiconductor device.

7 Claims, 2 Drawing Sheets

METHOD FOR ASSEMBLING A CHIP CARRIER TO A SEMICONDUCTOR DEVICE

BACKGROUND OF THE INVENTION

The present invention relates generally to electronic packaging, and more particularly, relates to a method for preparing the electrical interconnections of a chip carrier, including planarization, for subsequent joining to a semiconductor device.

Semiconductor devices can be connected to their supporting carrier by any number of methods. One particularly preferred method is called controlled collapse chip connection or simply C-4. In the C-4 method, small solder balls are formed on the input/outputs (I/Os) of the semiconductor device. The semiconductor device is joined to its supporting carrier by aligning the small solder balls on the semiconductor device with corresponding pads on the surface of the supporting carrier, followed by reflowing to cause bonding of the solder balls to the pads of the supporting carrier.

Ceramic chip carriers are a favored substrate for supporting semiconductor devices having C-4s. Ceramic chip carriers, however, suffer from camber and other surface irregularities resulting from their processing which leaves the joining surface of the ceramic substrate less than planar. Similar although less extreme variations can occur with organic chip carriers.

When connecting semiconductor devices having C-4s, variations in the planarity of the chip carrier can result in interconnection defects.

Accordingly, it would be desirable to have a method of preparing the electrical interconnections of a chip carrier to facilitate the subsequent joining thereto of a semiconductor device having C-4s.

Martin et al. IBM Technical Disclosure Bulletin, 23, No. 5, p. 1877, October 1980, the disclosure of which is incorporated by reference herein, disclose shaving the surface of a chip or wafer to expose solder balls previously encapsulated by polyimide. Additional solder is then deposited on the shaved solder balls. The shaving is not done for planarization since the chip or wafer surface is initially flat.

Pasch U.S. Pat. No. 5,468,681, the disclosure of which is incorporated by reference herein, discloses an interposer for joining a chip to a substrate. The interposer contains conductive plastic filled vias. Excess conductive plastic material is removed from the interposer with a so-called "doctor's knife".

Variot et al. U.S. Pat. No. 5,435,482, the disclosure of which is incorporated by reference herein, discloses the planarizing of solder balls on the bottom of an integrated circuit package in preparation for joining to a circuit board. The solder balls are planarized by pressing on a platen which may be heated. The solder balls are reflowed upon joining to the circuit board. The reference teaches that the solder balls are planarized to mitigate warpage or bowing of the integrated circuit package, as shown in FIG. 5 of the reference.

Liebman et al. U.S. Pat. No. 5,167,361, the disclosure of which is incorporated by reference herein, discloses the flattening of solder bumps on a printed circuit board in preparation for joining to a surface mounted component, e.g., an integrated circuit device. Flattening may be by a vice and platen or by cutting with a circular blade, saw or Q-cutter. Once the contact points of a surface mounted component make contact with the flattened solder, the solder is then reflowed.

McShane U.S. Pat. No. 4,661,192, the disclosure of which is incorporated by reference herein, discloses applying solder balls to an integrated circuit die, flattening the solder balls by pressing against a platen (the solder balls may be heated) and then joining the integrated circuit die to a die support frame by the use of conductive epoxy.

Gshwend U.S. Pat. No. 4,752,027, the disclosure of which is incorporated by reference herein, discloses that solder bumps are applied to a printed circuit board then flattened by a roller. A surface mountable component is placed on the flattened solder bumps and then the solder bumps are reflowed.

Granier et al. U.S. Pat. No. 5,324,892, the disclosure of which is incorporated by reference herein, discloses the joining of solder columns to a substrate. The columns are planarized so that they are all at the same height and then are joined to a second substrate by applying a further quantity of solder to the solder columns or the second substrate.

In view of the above, it is a purpose of the present invention to have an improved method for fabricating an electrical interconnection between a chip carrier and a semiconductor device having C-4 connections.

BRIEF SUMMARY OF THE INVENTION

The present invention relates to a method for assembling a chip carrier to a semiconductor device having C-4 solder connections, the method comprising the steps of:

forming a plurality of solder shapes on a chip carrier;

planarizing the plurality of solder shapes resulting in the plurality of solder shapes having a planar surface, all of the planarized solder shapes being in the same plane;

placing a semiconductor device having C-4 solder connections on the chip carrier with the C-4 solder connections aligned with the plurality of solder shapes; and heating the plurality of solder shapes and C-4 solder connections to cause melting of the plurality of solder shapes and C-4 solder connections and bonding of the chip carrier and semiconductor device.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
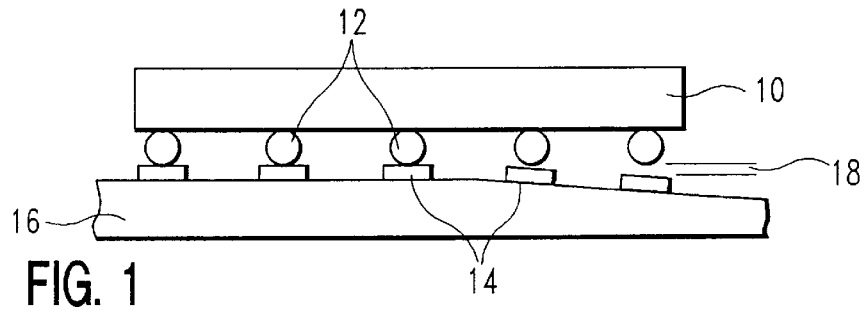
FIG. 1 is a side view of an assembled semiconductor device and a chip carrier illustrating incomplete electrical contact between the C-4 solder connections of the semiconductor device and the pads of the chip carrier.

Referring to the Figures in more detail, and particularly referring to FIG. 1, there is shown semiconductor device 10 having C-4 solder connections 12 joined to pads 14 of chip carrier 16. Chip carrier 16, however, is not planar so that not all C-4 solder connections 12 make good electrical contact with pads 14, as illustrated by gap 18. Such an assembled structure as shown in FIG. 1 is wholly unacceptable since it is imperative that all C-4 solder connections 12 make good electrical contact with all of the pads 14. If possible, the structure shown in FIG. 1 would be reworked; at worse, it would need to be scrapped. In either case, the costs of manufacture increase.

The present inventors have found, however, a solution to the defective structure found in FIG. 1. According to the present invention, sacrificial solder is formed on pads 14 of the chip carrier and then planarized to result in a good planar surface profile for subsequent joining to a semiconductor device.

Figure 2A:
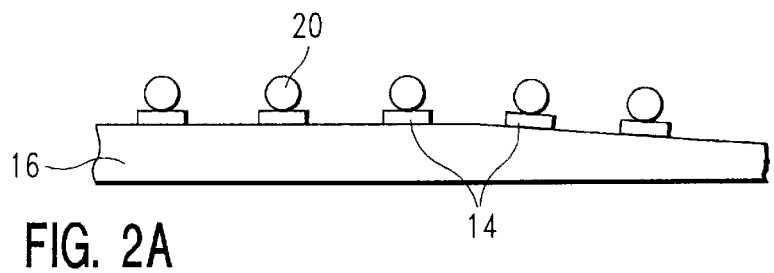
FIGS. 2A–2D are side views illustrating the method of assembly of a semiconductor device and a chip carrier according to the present invention.
Figure 2B:
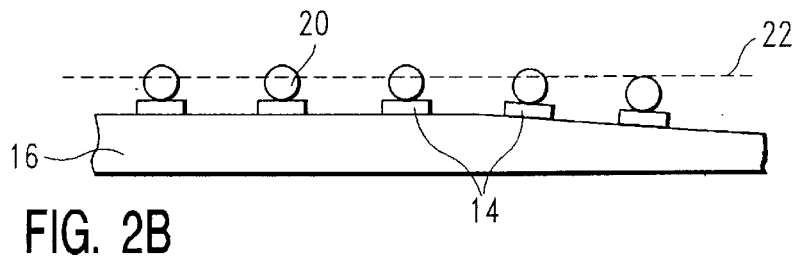

The method according to the present invention will be described in detail with reference to FIGS. 2A to 2D. Referring to FIG. 2A, a portion of chip carrier 16 is shown having pads 14. As a result of manufacturing, chip carrier 16 is not completely planar in that it may have camber or bowing or other surface irregularities. A plurality of solder shapes 20 have been formed on pads 14. The plurality of solder shapes 20 may be conventionally formed by screening solder paste directly on to pads 14 and then reflowing.

Alternatively, the plurality of solder shapes may be conventionally formed by using a decal or a dummy chip to deposit an array of solder shapes as described in Puttlitz et al. "Solder Transfer Technique for Flip Chip and Electronic Assembly Application", Proceeding —1996 Electronic Components and Technology Conference (IEEE 46$^{th}$ ECTC), Orlando, Fla., 1996, pps. 559–564, the disclosure of which is incorporated by reference herein. The solder shapes can be formed on a dummy chip in the same array as pads 14 on the chip carrier in the following manner. Semiconductor wafers with a deposited dielectric layer such as $SiO_2$, $Si_3N_4$ or polyimide are used to fabricate an array of thin Au pads followed by an array of desired solder mass. The deposition is typically done by evaporation under high vacuum using metal or glass masks which are kept in intimate contact with the semiconductor wafer. After evaporation, the masks are removed, and the wafer diced into dummy chips. Each chip contains the desired array of solder mass. These chips are then individually aligned to pad array 14 on chip carrier 16. The assembly of chip carrier 16, and chip containing solder mass array is reflowed in a furnace to melt the solder. Upon melting, each solder mass wets the corresponding pad 14, forms a metallurgical bond, and transfers to the chip carrier. The transfer is facilitated by the dissolution of the thin Au layer on the diced chip into the molten solder mass, and the resulting loss of adhesion of the solder mass to the silicon substrate. The dummy chip is discarded after flux cleaning of the chip carrier-dummy chip assembly.

As shown in the Figures, the plurality of solder shapes 20 are solder balls. While not shown, the plurality of solder shapes 20 may also be short posts. Other solder shapes, while meeting the objectives of the present invention, are not excluded.

It would be desirable to present a planar surface for joining to the semiconductor device 10. An imaginary planar surface is represented by line 22 in FIG. 2B.

Figure 2C:
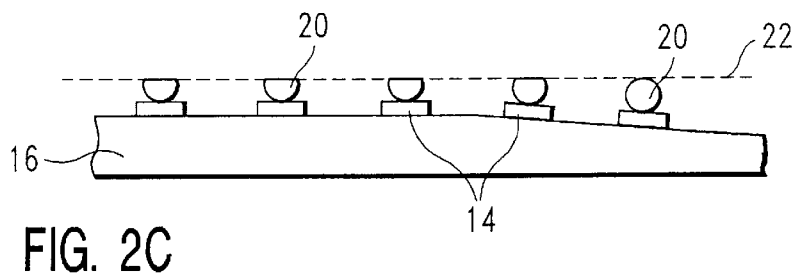
Figure 2D:
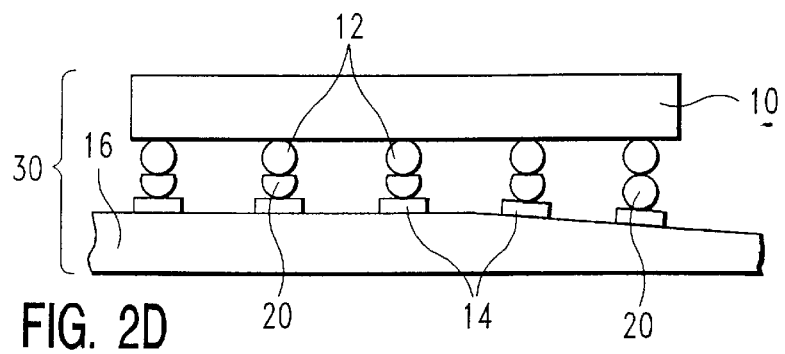

Next, the plurality of solder shapes 20 are planarized to result in the plurality of solder shapes 20 having a planar surface as shown in FIG. 2C. All of the plurality of solder shapes 20 have a planar surface and all of the planar surfaces are in the same plane, again represented by imaginary plane 22. The means for planarization will be discussed hereafter.

Lastly, a semiconductor device 10 is joined to chip carrier 16. C-4 solder connections 12 of semiconductor device 10 are aligned with the plurality of solder shapes 20 of chip carrier 16. The whole assembly is then heated to a sufficient temperature to cause melting of the plurality of solder shapes 20 and the C-4 connections 12, thereby bonding semiconductor device 10 to chip carrier 16. The resultant structure 30 has good electrical connection between the semiconductor device 10 and chip carrier 16 with no gaps between electrical connections as disclosed in FIG. 1.

The preferred chip carrier 16 for the present invention is a ceramic substrate as these articles tend to have more pronounced camber. However, organic chip carriers would also benefit from the present invention.

Figure 3:
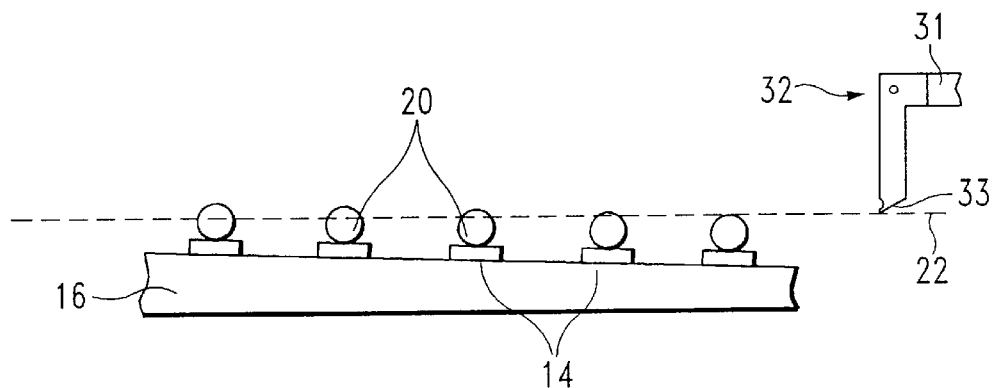
FIG. 3 is a side view illustrating a first method according to the present invention of planarizing the solder shapes on a chip carrier.
Figure 4:
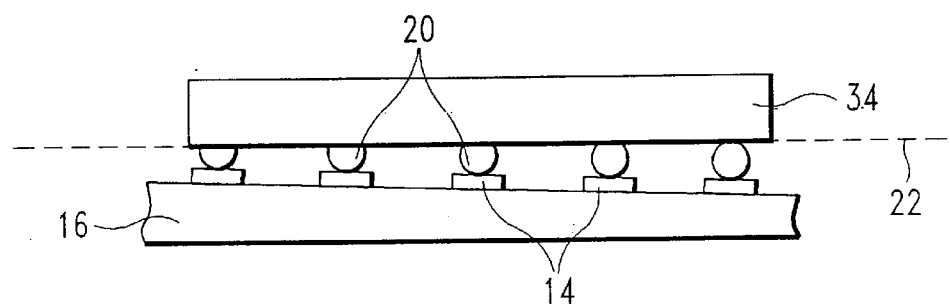
FIG. 4 is a side view illustrating a second method according to the present invention of planarizing the solder shapes on a chip carrier.
Figure 5:
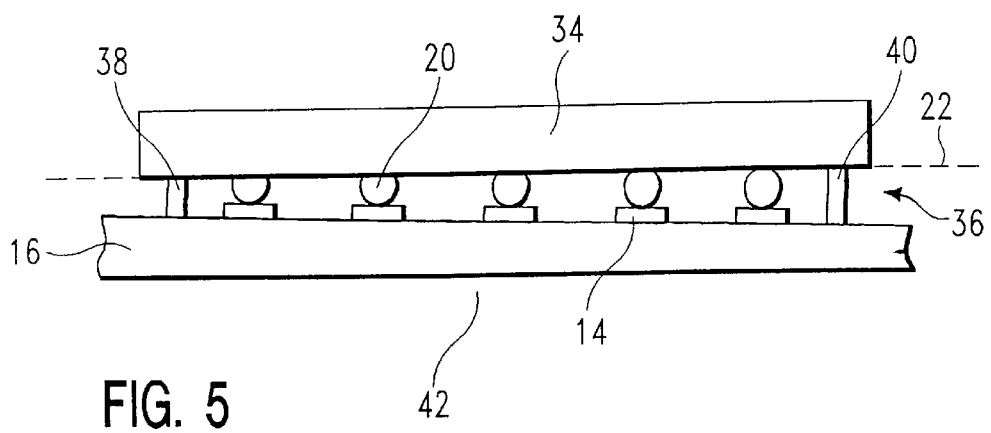
FIG. 5 is a side view illustrating a third method according to the present invention of planarizing the solder shapes on a chip carrier.

Referring now to FIGS. 3 to 5, preferred methods for planarizing the plurality of solder shapes 20 will now be discussed and illustrated.

The most preferred method for planarizing the plurality of solder shapes 20 is by shaving using tool 32, as illustrated in FIG. 3. Conventional fixturing 31 would be required so that tool 32 shaves along imaginary plane 22. In practice, blade 33 of shaving tool 32 would be traversed across the solder shapes 20, removing all the solder above imaginary plane 22. Shaving is relatively simple to implement and tooling is relatively inexpensive.

Alternatively, heated porous copper block 34 may be utilized to planarize the plurality of solder shapes 20 along imaginary plane 22 as shown in FIG. 4. Porous copper blocks are conventional in nature and are typically used to dress solder sites during rework. The porous copper block 34 utilized here has a planar surface so that when pressed against the plurality of solder shapes 20, a portion of the solder from the plurality of solder shapes 20 is absorbed into the porous copper block 34, leaving a planar profile along imaginary plane 22.

It may be awkward to utilize the porous copper block 34 so that the plurality of solder shapes 20 forms a planar profile along imaginary plane 22 approximately parallel to planar bottom surface 42 of chip carrier 16. Accordingly, as shown in FIG. 5, a plurality (at least three) of standoffs 36 could be used. The plurality of standoffs 36 would be sized so that a planar profile corresponding to imaginary plane 22 would be obtained. As shown in FIG. 5, standoff 38 is sized smaller than standoff 40 to result in the planar profile corresponding to imaginary plane 22.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method for assembling a chip carrier to a semiconductor device having C-4 solder connections, the method comprising the steps of:

forming a plurality of solder shapes on a nonplanar surface of a chip carrier;

planarizing the plurality of solder shapes resulting in the plurality of solder shapes having a planar surface, all of the planarized solder shapes being in the same plane;

placing a semiconductor device having C-4 solder connections on the chip carrier with the C-4 solder connections aligned with the plurality of planarized solder shapes; and heating the plurality of solder shapes and C-4 solder connections to cause melting of the plurality of solder shapes and C-4 solder connections and bonding of the chip carrier and semiconductor device.

2. The method of claim 1 wherein the step of planarizing the plurality of solder shapes comprises shaving the solder shapes along a predetermined plane.

3. The method of claim 1 wherein the step of planarizing the plurality of solder shapes comprises applying a heated, planar copper porous block to the solder shapes in a predetermined plane to absorb a portion, but not all, of the solder shapes.

4. The method of claim 3 further comprising a plurality of standoffs on the chip carrier, the height of the standoffs representing the height of the parallel plane with respect to the chip carrier.

5. The method of claim 1 wherein the solder shapes are solder balls.

6. The method of claim 1 wherein the chip carrier is a ceramic substrate.

7. The method of claim 1 wherein the chip carrier is an organic substrate.

* * * * *